US 7,495,979 B2

(12) United States Patent
Chung

(10) Patent No.: US 7,495,979 B2
(45) Date of Patent: Feb. 24, 2009

(54) METHOD AND SYSTEM FOR IN-SITU PARAMETRIC SRAM DIAGNOSIS

(75) Inventor: Shine Chien Chung, Taipei Hsien (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 660 days.

(21) Appl. No.: 11/089,975

(22) Filed: Mar. 25, 2005

(65) Prior Publication Data

US 2008/0130385 A1 Jun. 5, 2008

(51) Int. Cl.
*G11C 7/00* (2006.01)
(52) U.S. Cl. ............. 365/201; 365/189.02; 365/230.02
(58) Field of Classification Search ............. 365/201, 365/189.02, 230.02
See application file for complete search history.

(56) References Cited

U.S. PATENT DOCUMENTS 5,255,230 A  10/1993  Chan et al. ............. 365/201
6,081,464 A *  6/2000  Marr ..................... 365/201
6,081,465 A    6/2000  Wang et al. ............. 365/201
6,212,115 B1   4/2001  Jordan .................... 365/201

\* cited by examiner

*Primary Examiner*—Richard Elms
*Assistant Examiner*—Nam Nguyen
(74) *Attorney, Agent, or Firm*—K & L Gates LLP

(57) ABSTRACT

This invention is about a system for diagnosing memory cells in a memory module. A first multiplexer module selectively connects a diagnosis signal in response to a multiplexer control signal to a data line associated with a predetermined memory cell. A second multiplexer module connects the data line to the predetermined memory cell via the bit line in response to a bit selection signals. Similarly, a complement diagnosis signal may be connected to a predetermined memory cell via the complement data line and bit line through the same control and bit select signals. A pair of access pads are provided for passing the diagnosis signal and the complement diagnosis signal for external accessing.

19 Claims, 3 Drawing Sheets

METHOD AND SYSTEM FOR IN-SITU PARAMETRIC SRAM DIAGNOSIS

BACKGROUND

The present disclosure relates generally to a method and system for measuring cell stabilities in a real SRAM product with in-situ parametric diagnosis.

Memory cells of an SRAM product often require testing and diagnosis. However, the conventional methods for diagnosing SRAM are quite troublesome, costly, and inaccurate. Some of these conventional methods include bit mapping, node probing, and test structure measuring. The bit mapping method builds a map of passed and failed bits that correspond to their physical locations. While the method can provide statistical data of proximity effects or IR drops in power and ground buses, it cannot provide a noise margin for each bit cell. Node probing is another method for diagnosing SRAM by probing internal nodes such as bit lines, data lines, or sense amplifier outputs. As technology improves, metal widths within circuitry shrink. As such, probing by tips becomes increasingly difficult. Probing small areas require e-beams which can be very expensive and time consuming. Test structure measuring requires device nodes in an SRAM cell to be brought out to pads in test structures so that such node voltage can be measured, but the test environment tends to deviate from the real SRAM environment. The result is the inability to provide yield enhancement information of each bit cells. Even though all these methods are useful, however, there is still room for improvement on efficiency and accuracy.

It is always desirable to have an efficient, accurate, and low cost system for SRAM cells measurements.

SUMMARY

In view of the foregoing, this disclosure provides a system for diagnosing a plurality of memory cells in a memory module. A first multiplexer module is used for selectively connecting a diagnosis signal in response to a multiplexer control signal to a data line associated with a predetermined memory cell. A second multiplexer module connects the data line to the predetermined memory cell via a bit line in response to a bit selection signals. An access pad is provided for passing the diagnosis signal for external access and analysis.

The construction and method of operation of the invention, however, together with additional objects and advantages thereof will be best understood from the following description of specific embodiments when read in connection with the accompanying drawings.

DESCRIPTION

The present disclosure provides a method and system for diagnosing a memory cell in a memory module, such as an SRAM module. This invention provides a plurality of multiplexers connecting the memory cell through data lines to at least one external access pad. This system improves the currently available diagnosis mechanisms by simply using a few extra access pads and relevant selection modules to perform those mechanisms. The system can support various diagnosis methods better than bit mapping, node probing, and even node measuring on test structures. With such features available in this new method, the memory module diagnosis can be performed easily and accurately.

Figure 1:
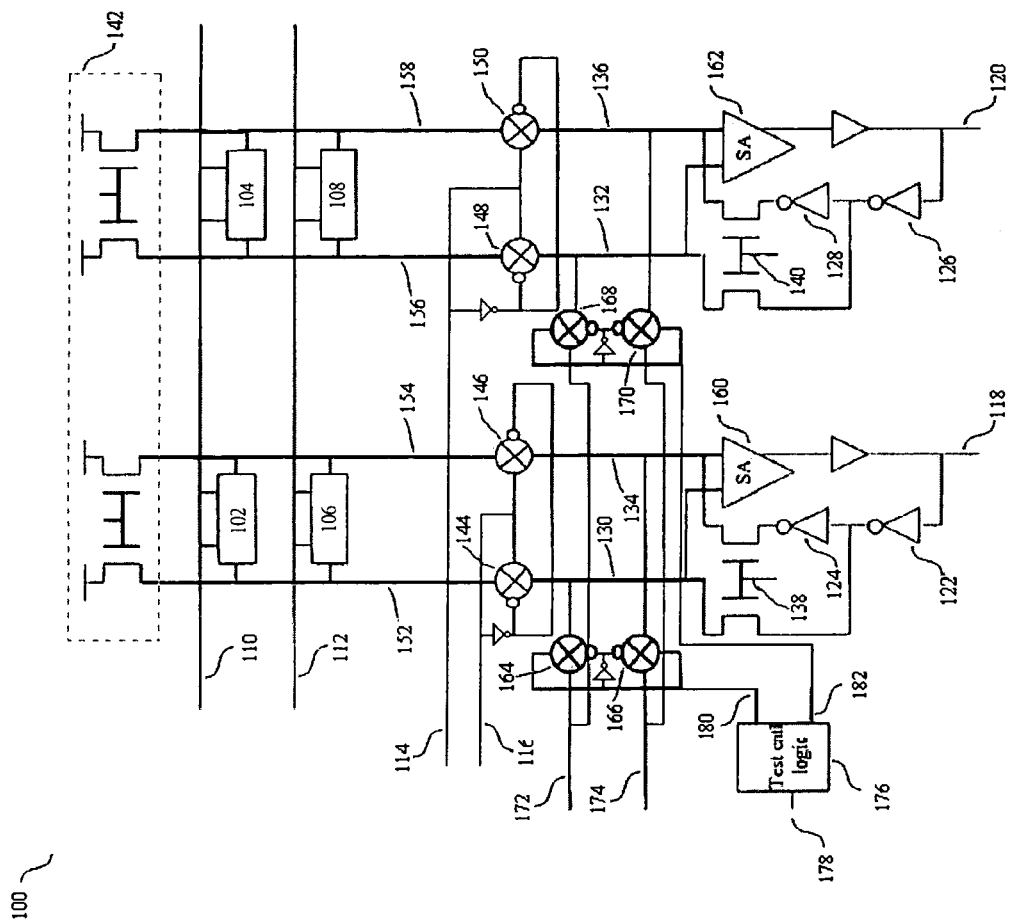
FIG. 1 illustrates a modified memory circuit with in-situ diagnosis system according to one embodiment of the present invention.

FIG. 1 schematically illustrates a 2-by-2 SRAM module 100 incorporated with a proposed diagnosis system according to one embodiment of the present invention. Data in memory cells 102, 104, 106, and 108 can be modified, retrieved, and even tested in this module 100. It is however understood that the method disclosed herein may also apply to SRAM of other sizes and configurations.

Both the write-in and read processes for the memory cells require several signals from different input pins. During the data modification process, a few of memory cells can be changed at a time, and the location addresses for that memory cells have to be assigned. Memory cells are organized in a form of matrix. In order to select a certain location, the corresponding X and Y coordinates have to be provided. Word selection signals 110 and 112 determine the row number which is the X value, and bit selection signals 114 and 116 determine the column number which will be the Y value. These values work together to determine which memory cells are to modify or read from.

During a write-in process on this example circuit, I/O pins 118 and 120 input the data that need to be stored. As the input data first enter the system, the data are split by inverters 122, 124, 126 and 128 into a pair of original signal and complement signal. The complement signals travel on data lines 130 and 132, and the original signals travel on complement data lines 134 and 136. Write enable switches 138 and 140 determine whether and when the data are written into the cells. If the switches are off, the data will not pass on. As the data come up through the data lines, bit line select signals 114 and 116 control the select gates 144, 146, 148, and 150, each pair collectively referred to as the second multiplexer module. This determines which Y columns the data will be written into. From this point on in this example, the signals continue on the bit lines 152 and 156 and complement bit lines 154 and 158. Word line signals 110 and 112 will determine the X row of the memory cell. With both word and bit select signals provided, a specific set of memory cells are located. The data on the bit lines will be written into those memory cells.

The retrieval process of data is quite similar since those specific memory cells still require word signals 110 and 112 and bit select signals 114 and 116 in order to be located. The bit line pull up device 142 needs to charges up to stabilize the memory cells. Once the specific memory cells are selected, the data within will travel through the bit lines 152 and 156 and complement bit line 154 and 158. Once again, the data lines and complement data lines are determined by the memory cells' locations. For example, if the data are stored in memory cell 102, the data will travel on bit line 152 and complement bit line 154. As the data travel down the sets of bit lines and complement bit lines through the select gates 144, 146, 148, and 150, write enable switches 138 and 140 will be turned off, thereby forcing the data to enter through the sense amplifiers 160 and 162 for output. The data will travel through the amplifiers and exit the system through the I/O pins 118 and 120. In most SRAM designs, each pair of data line and its complement are shared by a number of select gates. For example, the data line 130 and its complement 134 are shared by the select gates 144 and 146, which are further associated with bit line 152 and its complement 154. The same is true for the data line 132 and its complement 136. The abundance of bit lines, bit line complements, and their associated select gates are not shown in FIG. 1 for simplicity.

In order to perform an accurate parametric SRAM diagnosis, at least one access pad is provided on board to allow easy access to memory cells in a memory module under testing. As shown in the exemplary memory module 100, the data lines 130,132 and complement data lines 134, and 136 are further multiplexed by select gates 164, 166, 168, and 170 (collectively referred to as the first multiplexer module) into two signals: a diagnosis signal 172 and its complement signal 174. The select gates 164, 166, 168, and 170 provide an access between the memory cells 102, 104, 106, 108 and an access pad. A user can operate the diagnosis system by enabling the test control logic module 176 with a test enable pin 178. The multiplexer control signals 180 or 182 can be generated by the test control logic module 176 or by using bidirectional I/O pins 118 and 120 to specify which I/O blocks to test in a test mode. In the test mode, a selected I/O pin can be pulled high and others remain low to indicate which I/O path is selected and its associated memory cell that is under test. Since there are many address lines and I/O lines to specify in a RAM embedded into a system, the Joint Test Action Group (JTAG) standard can be used to scan data, addresses, and control lines in series to reduce the pin count. Once the test enable pin 178 is enabled and at least one of the I/O signals is asserted, the selected bit line and complement bit line are connected to the diagnosis signal 172 and complement diagnosis signal 174 for external access to the memory cell 102, 104, 106 or 108. In such case, a viable connection is established between the access pad and the selected memory cell via the above motioned conducting lines and devices.

While incorporating the above described system for parametric SRAM testing, tests and measurements such as butterfly maps, transition voltage, current measurement, and even AC measurements may be obtained for memory cell diagnosis.

Figure 2:
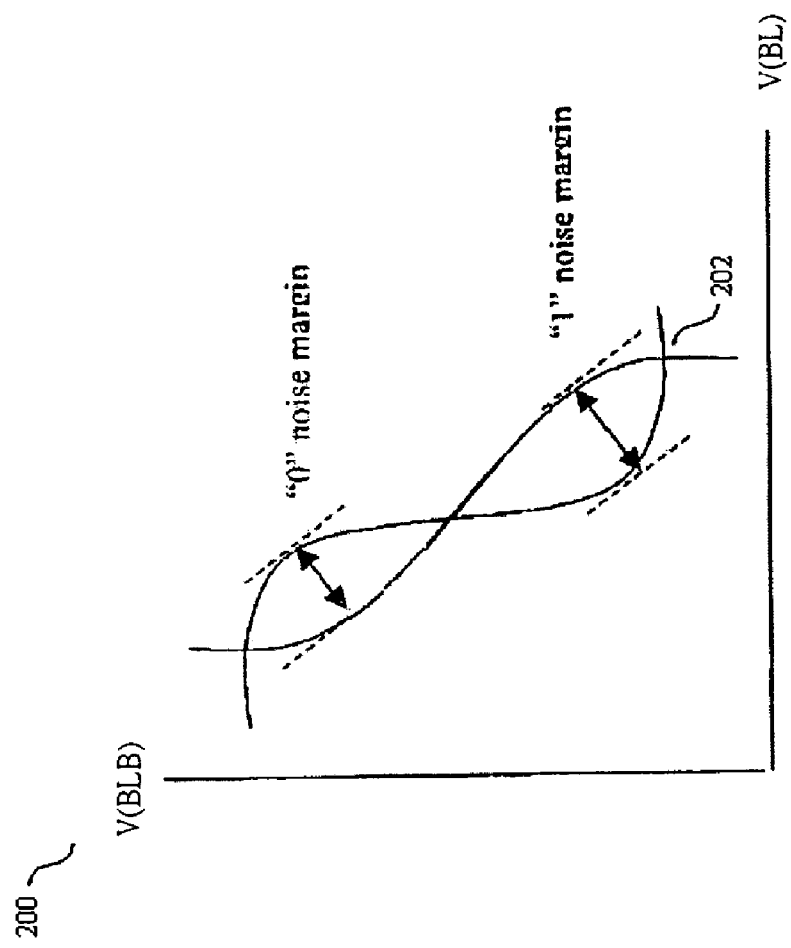
FIG. 2 illustrates a butterfly curve from which a noise margin of a predetermined memory cell is derived according to one embodiment of the present invention.

FIG. 2 illustrates an example butterfly map 200 test showing the curves 202 of noise margin. With proper X and Y addresses along with input and output signals selection, any SRAM cell in a product can be selected. After enabling the test by setting pin 178 to high in module 100 of FIG. 1, the corresponding bit line 152 or 156 and its complement bit line 154 or 158 are connected to the access pad for external accessing. The diagnosis signal 172 is connected to the memory cell, say 102, via the select gate 164, the select gates 144, and the bit line 152. Similarly, the complement diagnosis signal 174 is connected to the memory cell 102 via the select gate 166, the select gate 146 and the complement bit line 154. Since the bit line 152 and its complement 154 are connected to a pair of diagnosis signals 172 and 174 through the bi-directional select gates 164, 166, 144, and 146, various diagnosis methods can be applied. Once the bi-directional connections between diagnosis signal and bit line have been established, the signals on the bit line can be accessed via the access pad for diagnosis purposes. The diagnosis methods include, but not limited to, varying the voltage of the diagnosis signal 172 and measuring the voltage of the complement diagnosis signal 174; fixing the voltage of the diagnosis signal and drawing the I-V curve for the diagnosis complement signal 174, and so on.

A butterfly curve can be obtained by graphically presenting a relationship between the diagnosis signal 172 and the complement diagnosis signal 174. The "0" and "1" noise margins of each cell can be obtained by finding the maximum width of the lobes shown in FIG. 2. With these noise margin data, the cell margins of an SRAM can be measured and built into a margin map for further yield analysis. SRAM can be fine-tuned, based on the signal noise margin map, to compensate physical proximity effect. Once the weak spots are located in the margin map, modifications of layout can be made to increase the margin.

Figure 3:
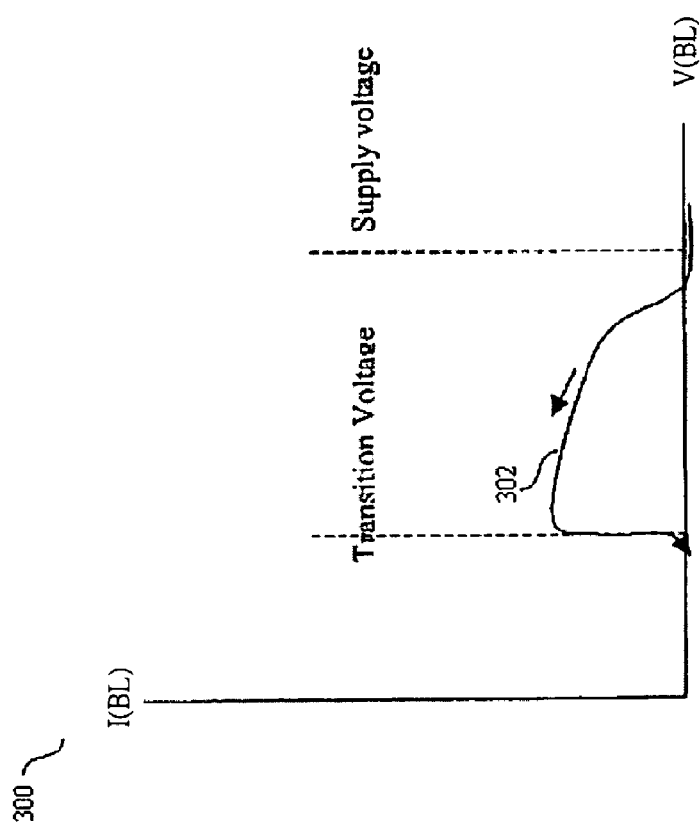
FIG. 3 illustrates an I-V curve showing a transition voltage of a predetermined memory cell according to one embodiment of the present invention.

FIG. 3 illustrates an example of a result graph 300 created from the transition voltage and current measurements, which is one of the tests that can be performed with this system. Assuming the cell 102 is selected, the write transition voltage and current can be measured by writing "1" to the cell first. The voltage level on bit line 152 in module 100 of FIG. 1 is then forced low gradually while monitoring the current flowing through the bit line 152. This I-V curve can be measured by using a curve tracer connecting to the diagnosis signal 172. The cell current will increase to a point then decrease sharply when the cell value is flipped from "1" to "0." The transition voltage and current can indicate of how strong the cell is. The transition voltage and current curve 302 on the bit line 152 is shown in the graph. In this method, the complement bit line 154 can be held at a fixed voltage, such as a supply voltage, or let floating. If bit line complement 154 is held at a fixed high voltage, the transition in the curve 302 will be sharper. Since the complement bit line 154 is connected to complement diagnosis signal 174, it can be held fixed or let floating to serve the purpose. Similar procedure can be applied to measure transition of "0" to "1" by writing "0" to the cell 102 and pulling the complement bit line 154 of module 100 of FIG. 1 to low. The transition voltage and current can be measured for all bits in an SRAM for further yield analysis. With these measurements, read margin map can be created and help locate weak spots of the SRAM. Layout can then be modified for margin increase.

Another test that can be applied on this invention is AC measurement. Instead of using DC measurement like the butterfly map test and transition voltage and current measurements, this method can use AC measurement to measure how fast the bit line split when the cells are selected and activated. When the cell in circuit 100 of FIG. 1 is selected in the test mode, the bit line voltage split can be measured externally through the signals 172 and 174 to access pads, while the word lines 110 and 112 are switching. The external loading of the diagnosis pads and the impedance of the additional test multiplexers need to be considered and compensated.

The above disclosure provides many different embodiments or examples for implementing different features of the disclosure. Specific examples of components and processes are described to help clarify the disclosure. These are, of course, merely examples and are not intended to limit the disclosure from that described in the claims.

Although the invention is illustrated and described herein as embodied in a design and method for diagnosing memory cells, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the disclosure, as set forth in the following claims.

What is claimed is:

1. A system for diagnosing a plurality of memory cells in a memory module, the system comprising:
   a first multiplexer module for selectively connecting a diagnosis signal in response to at least one multiplexer control signal to a data line associated with a predetermined memory cell; and a second multiplexer module for connecting the data line to the predetermined memory cell via a bit line in response to one or more bit selection signals for analyzing the same.

2. The system of claim 1 further comprising a complement diagnosis signal connecting to a complement data line via the first multiplexer module.

3. The system of claim 2 further comprising one or more access pads for passing the diagnosis signal and the complement diagnosis signal to or from the first multiplexer module.

4. The system of claim 2 wherein the diagnosis signal and the complement diagnosis signal are controlled and analyzed to obtain a noise margin of the predetermined memory cell.

5. The system of claim 4 further comprising a noise margin map reflecting relations between the noise margin and each corresponding memory cell for the memory module.

6. The system of claim 2 wherein the diagnosis signal and the complement diagnosis signal are controlled and analyzed to obtain a transition voltage associated with the predetermined memory cell.

7. The system of claim 2 wherein the diagnosis signal and the complement diagnosis signal are controlled and analyzed to obtain a bit line split rate associated with the predetermined memory cell.

8. The system of claim 1 wherein the first multiplexer module and the second multiplexer module each further includes one or more bidirectional select gates.

9. The system of claim 1 further comprising at least one test control logic module for generating the multiplexer control signal.

10. The system of claim 1 further comprising an I/O pin associated with the predetermined memory cell for generating the multiplexer control signal.

11. The system of claim 10 wherein the I/O pin and the memory cells are selected by using a joint test action group (JTAG) standard for analyzing the predetermined memory cell.

12. A method for testing a memory module by using a memory testing system, the memory testing system comprising a first multiplexer module for selectively connecting a diagnosis signal to a data line associated with a predetermined memory cell, and a second multiplexer module for connecting the data line to the predetermined memory cell via a bit line, the method comprising:

selecting the predetermined memory cell for testing;
inputting the diagnosis signal to the predetermined memory cell via the first multiplexer module, the second multiplexer module, the data line and the bit line;
reading a complement diagnosis signal resulted from the predetermined memory cell via a complement bit line and a complement data line; and
obtaining at least one characteristic information of the predetermined memory cell based on the complement diagnosis signal and the diagnosis signal.

13. The method of claim 12 wherein the obtaining comprises graphically presenting a relationship between the diagnosis signal and the complement diagnosis signal to obtain a butterfly curve.

14. The method of claim 13 wherein the obtaining comprises deriving a noise margin of the predetermined memory cell based on the butterfly curve.

15. The method of claim 14 further comprising building a map reflecting relations between the noise margin and each corresponding memory cell for the memory module.

16. A method for testing a memory module by using a memory testing system, the memory testing system comprising at least one multiplexer module for selectively creating an access between an access pad and a predetermined memory cell via a bit line associated therewith, the method comprising:

selecting a predetermined memory cell for testing;
writing a high voltage signal representing a value of logic "1" to the predetermined memory cell;
forcing a voltage level on the bit line to decrease;
monitoring a current flow on bit line from the access pad; and
obtaining a transition voltage of the predetermined memory cell when a substantially sharp current transition indicates that the value of the predetermined memory cell has flipped from "1" to "0."

17. The method of claim 16 further comprising obtaining a device strength of the predetermined memory cell base on a relationship between the current and the voltage level on the bit line.

18. A method for testing a memory module by using a memory testing system, the memory testing system comprising at least one multiplexer module for selectively creating an access between an access pad and a predetermined memory cell via a bit line associated therewith, the method comprising:

selecting a predetermined memory cell for testing;
writing a low voltage signal representing a value of logic "0" to the predetermined memory cell;
forcing a complement voltage level on a complement bit line to decrease;
monitoring a complement current flow on complement bit line from the access pad; and
obtaining a transition voltage of the predetermined memory cell when a substantially sharp current transition indicates that the value of the predetermined memory cell has flipped from "0" to "1."

19. The method of claim 18 further comprising obtaining a device strength of the predetermined memory cell base on a relationship between the complement current and the complement voltage level on the complement bit line.

* * * * *